United States Patent [19]

Mizutani et al.

[11] Patent Number: 4,479,297
[45] Date of Patent: Oct. 30, 1984

[54] METHOD OF FABRICATING THREE-DIMENSIONAL SEMICONDUCTOR DEVICES UTILIZING $CeO_2$ AND ION-IMPLANTATION.

[75] Inventors: Yoshihisa Mizutani; Shinichiro Takasu, both of Tokyo, Japan

[73] Assignee: Tokyo Shibaura Denki Kabushiki Kaisha, Kawasaki, Japan

[21] Appl. No.: 386,808

[22] Filed: Jun. 9, 1982

[30] Foreign Application Priority Data

Jun. 22, 1981 [JP] Japan .................. 56-95344

[51] Int. Cl.³ .................. H01L 21/20; H01L 21/265
[52] U.S. Cl. .................. 29/571; 29/576 B; 29/576 E; 29/578; 29/580; 148/1.5; 148/174; 148/175; 156/612; 156/615; 156/DIG. 63; 357/4; 357/49; 357/50; 357/54
[58] Field of Search .................. 29/571, 576 B, 576 E, 29/578, 580; 148/1.5, 174, 175; 427/38, 34; 156/612, 615, DIG. 63; 357/4, 49, 50, 54; 423/263

[56] References Cited

U.S. PATENT DOCUMENTS

| | | | |
|---|---|---|---|
| 3,564,358 | 2/1971 | Hahnlein | 148/175 X |
| 3,649,351 | 3/1972 | Grabmaier | 148/175 X |
| 3,655,439 | 4/1972 | Seiter | 148/175 X |
| 3,698,966 | 10/1972 | Harris | 148/187 |
| 4,396,930 | 8/1983 | Mizutani | 357/41 X |

FOREIGN PATENT DOCUMENTS

| | | |
|---|---|---|
| 57-178360 | 9/1982 | Japan . |
| 58-00177 | 3/1983 | Japan . |
| 969413 | 9/1964 | United Kingdom ........ 156/615 |

OTHER PUBLICATIONS

Toshiba Corp. "Semiconductor Device with Multilayer Structure" Chem. Abstracts, vol. 98, 1983, p. 631–CA 98(16)136108 x.

Toshiba Corp. "Semiconductor Device", Ibid, p. 653–CA 98(24)208541r.

Tamura et al., "Si Bridgining Epitaxy from Si Windows onto $SiO_2$ by Q-Switched Ruby Laser Pulse Annealing," Japanese Journal of Applied Physics, vol. 19, No. 1, Jan., 1980, pp. L23–26.

Nakagawa et al., "Computer-Aided Design Consideration on Low-Loss p-i-n Diodes," IEEE Transactions on Electron Devices, vol. ED-38, No. 3, Mar., 1981.

Geis et al., "Crystallographic Orientation of Silicon on an Amorphous Substrate Using an Artificial Surface-Relief Grating and Laser Crystallization," Appl. Phys. Lett. vol. 35, No. 1, Jul. 1, 1979.

Primary Examiner—William G. Saba
Attorney, Agent, or Firm—Finnegan, Henderson, Farabow, Garrett, Dunner

[57] ABSTRACT

A method for fabricating a three-dimensional multi-layer integrated circuit of single crystalline $CeO_2$ and Si is proposed.

This method is characterized in that a single crystalline $CeO_2$ insulation layer, or the like, is formed on a single crystalline Si substrate. An isolation region is formed in the single crystalline Si substrate. The region is transformed into a $SiO_2$ insulation layer by selectively introducing oxygen ions through the single crystalline $CeO_2$ insulation layer and reacting the oxygen ions with the single crystalline Si.

An epitaxial growth single crystalline Si layer is formed on the single crystalline $CeO_2$ insulation layer.

Predetermined processes, such as forming a single crystalline $CeO_2$ layer, are performed thereafter to form the three-dimensional structures of semiconductor elements such as MOS transistors and bipolar transistors with high packing density and reliability.

9 Claims, 19 Drawing Figures

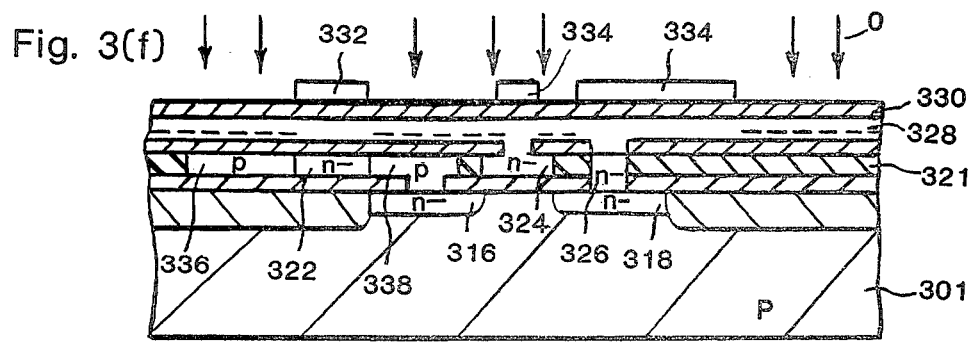
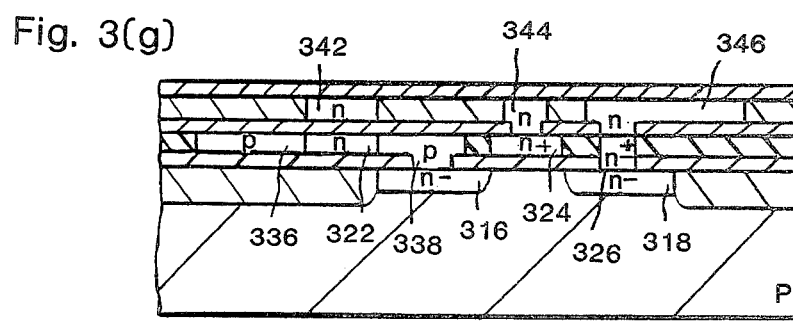
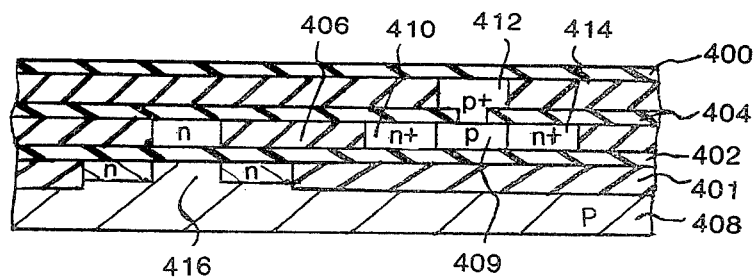

METHOD OF FABRICATING THREE-DIMENSIONAL SEMICONDUCTOR DEVICES UTILIZING CEO₂ AND ION-IMPLANTATION.

BACKGROUND OF THE INVENTION

This invention relates to the method of fabricating a semiconductor device, particularly to the method of fabricating a semiconductor device with a three-dimensional structure having a Metal Oxide Semiconductor (MOS) element.

The semiconductor devices in semiconductor integrated circuits usually consist of three layers having a Si substrate, a gate insulation layer and a gate electrode.

The insulation layers of these devices are usually formed of $SiO_2$. Such $SiO_2$ layers are often formed by thermally oxidizing the Si substrate or by using the Chemical Vapor Deposition (CVD) method. For electrical isolation among devices in a semiconductor integrated circuit a thick $SiO_2$ layer is formed by the same method. This is desirable for minimizing stray (parasitic) capacitance between the Si substrate and wirings of the surface part. However, the $SiO_2$ layers, which are formed by thermal oxidation or by the CVD method, are usually noncrystalline.

Therefore, after such noncrystalline $SiO_2$ layers are formed on the Si substrate, it is difficult for a single crystalline Si layer to be formed on the $SiO_2$ layer. The polycrystalline Si which is employed will include many more grain boundary defects than single crystalline Si. Consequently the carrier mobility of the polycrystalline Si is 100 times smaller than that of single crystalline Si. There is also a phenomena that a doped impurity in the grain boundary will diffuse the other grains. The grain boundary size grows during the thermal step as disclosed, for example, in the laser anneal technology disclosed in the Japanese Journal of Applied Physics, Vol. 19, No. 1, Jan., 1980, pp. 23—26. It is difficult to reproduce electrical characteristics of the semiconductor device under such conditions. Therefore, the formation of a single crystalline Si layer on the insulation layer is important for the realization of the three-dimensional integrated circuits.

SUMMARY OF THE INVENTION

Accordingly, it is an object of the present invention to provide a method of fabricating a semiconductor device having a three-dimensional structure of a single crystalline semiconductor layer and a single crystalline insulation layer.

It is another object of the present invention to provide a method of fabricating a semiconductor device which prevents the electrical potential of driving elements and wiring formed on the field insulation layer from influencing the characteristics of the elements around the field insulation layer.

Additional objects and advantages of the invention will be set forth in part in the description which follows, and in part will be obvious from the description, or may be learned by practice of the invention. The objects and advantages of the invention may be realized and attained by means of the processes particularly pointed out in the appended claims.

To acheive the objects and in accordance with the purposes of the invention, as embodied and broadly described herein, a method is provided for fabricating a semiconductor device including the steps of:

(a) creating on at least part of a first semiconductor layer, a single crystalline oxide insulation layer which is selected from the group consisting of cerium (Ce) and other rare earth elements where said layer belongs to a system which is selected from the group consisting of a tesseral system, a tetragonal system and an orthorhombic system;

(b) selectively introducing oxygen ions, which convert the semiconductor material into an insulation material by reacting with the first semiconductor layer, through the single crystalline oxide insulation layer into at least part of the first semiconductor layer;

(c) converting the region into which the ions are introduced into an insulation layer which is formed beneath said single crystalline oxide insulation layer; and (d) forming a second semiconductor layer on said single crystalline oxide insulation layer and said first semiconductor layer.

Furthermore, it is possible to increase the packing density of the semiconductor device, since the semiconductor device is formed of a multi-layer structure consisting of a semiconductor layer and a single crystalline insulation layer.

Also, when MOS transistors are formed in the semiconductor device, the single crystalline oxide insulation layer which serves as a gate oxide film of the MOS transistor and an insulation layer on the field insulation layer is formed on the semiconductor layer at the same time. The insulation layer on the field insulation layer may be formed sufficiently thick as necessary for the particular device.

BRIEF DESCRIPTION OF THE DRAWINGS

Other objects and advantages of the invention will become apparent from the following detailed description when taken in conjunction with the accompanying drawings, in which:

FIGS. 3(a) to 3(g) are sectional views illustrating an embodiment for manufacturing a CMOS inverter utilizing the method according to the present invention in sequential steps;

FIG. 4 is a partially sectional view illustrating an embodiment for manufacturing a bipolar transistor utilizing the method according to the present invention.

DETAILED DESCRIPTION OF THE PREFERRED EMBODIMENTS

In this invention, a single crystalline Si layer may be formed by epitaxial growth on and insulation layer other than a $SiO_2$ layer. Such insulation layer belongs to the tesseral system having a face-centered lattice if possible and the lattice constant of the insulation is nearly equal to that of the single crystalline silicon (Si). As one example a $CeO_2$ insulation layer can be selected. The lattice constant of $CeO_2$ is 5.416Å, which is nearly equal to that of single crystalline Si, i.e., 5.431Å. The epitaxial growth of Si of $30\mu$ m to $60\mu$ m thickness may be formed on the $CeO_2$ layer without a dislocation. A $CeO_2$ single crystalline layer may be also formed on the epitaxial growth single crystalline Si.

The reason why a thick insulation layer is used is that a thick insulation layer prevents the channel phenomenon induced by a wiring layer on the insulation layer.

The single crystalline oxide layer on which the epitaxial growth single crystalline Si is formed is a $CeO_2$ layer. The single crystalline Si can be grown on other such single crystalline oxide layers. For instance Ce and rare earth elements (referred to as R) and the single crystalline oxide insulation layer, which belongs to a tesseral system, a tetragonal system or a orthorhombic system such as $(Ce_x R_{1-x})O_2$ or $(Ce_x R_{1-x})O_4$, may be useful for forming the nondislocation single crystalline Si. Also, when the lattice constant of such a single crystalline oxide insulation layer is 0.99 to 1.01 of the lattice constant of Si, it is possible to form a sufficiently thick single crystalline Si layer on that insulation layer.

The CVD method can be used for the formation of the single crystalline oxide layer. Also it is possible to grow single crystalline Si on such layer.

According to the present invention, the $SiO_2$ layer is used as the first or lower insulation layer. But the silicon nitride layer or the silicon carbide layer may be used as the lower layer of the insulation layer instead of the $SiO_2$ layer by introducing nitrogen ions or carbon ions into the Si substrate. The nitrogen ions or the carbon ions are implanted into the Si substrate under conditions that the implantation energy is 110 keV and the dosage is $0.5 \sim 2.0 \times 10^{18}/cm^2$.

The Si substrate is used as a starting substrate in this invention. However a single crystalline layer deposited on the insulator substrate like sapphire and spinel may be used instead of the Si substrate as the starting substrate.

The present invention will now be described in more detail with reference to the figures.

FIGS. 1(a) to 1(g) are schematic sectional views for explaining the method of the present invention.

Figure 1A:
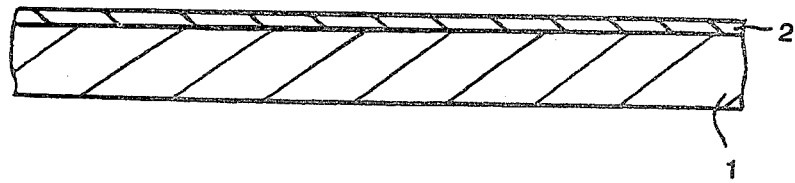
FIGS. 1(a) to 1(g) are sectional views illustrating one emobodiment of the method according to the present invention in sequential steps.

As shown in FIG. 1(a), a Si semiconductor substrate 1 used as a starting substrate, is placed in a vacuum exhausted to $10^{-7}$ torr. Oxygen gas, at a vacuum level of $10^{-6}$ torr is introduced to the surface of the semiconductor substrate 1. Under the aforementioned conditions, the temperature of the semiconductor substrate 1 is kept at 500° C. and a high density electron flow of Ce metal vapor is introduced.

An insulation layer such as a single crystalline $CeO_2$ layer 2 of 1000 Å thickness is formed on the semiconductor substrate 1 by the Verneuil method using a high frequency plasma torch.

Figure 1B:
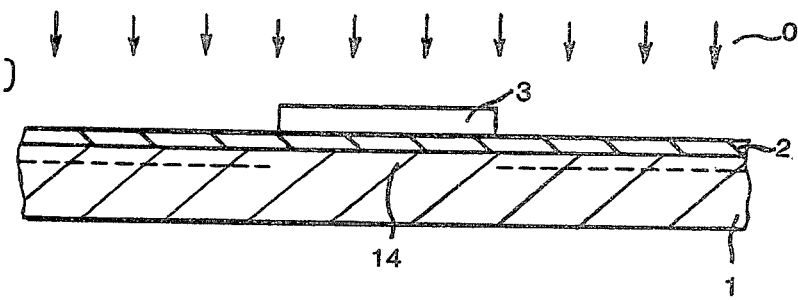

Next, as shown in FIG. 1(b), a photoresist layer 3 is selectively formed over region 14 where an active element is to be formed, for example an MOS transistor (not shown). Oxygen ions are implanted into the substrate 1 under the conditions of 100 keV and $1 \times 10^{18}/cm^2$ dose using the photoresist layer 3 as a mask.

Figure 1C:
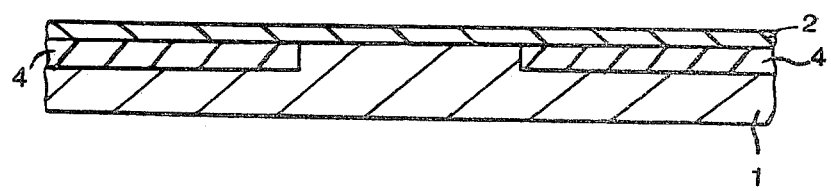

Then, as shown in FIG. 1(c), the oxygen ion implanted region is transformed into a $SiO_2$ insulation layer 4 by reaction of oxygen with the Si by a thermal process. This may be done by conventional techniques such as at the temperature of about 900° C. to 1000° C. for 30 minutes. The transformed $SiO_2$ layer 4 is under and closely contacted with the single crystalline $CeO_2$ layer 2. As shown, the photoresist layer is removed.

Figure 1D:
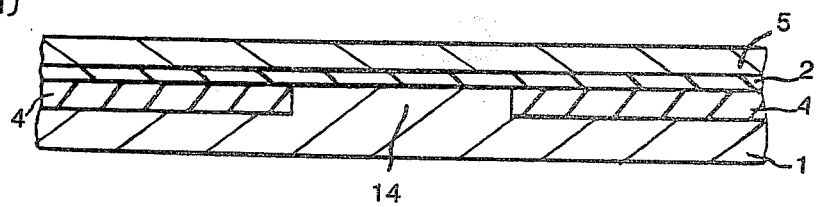
Figure 1E:
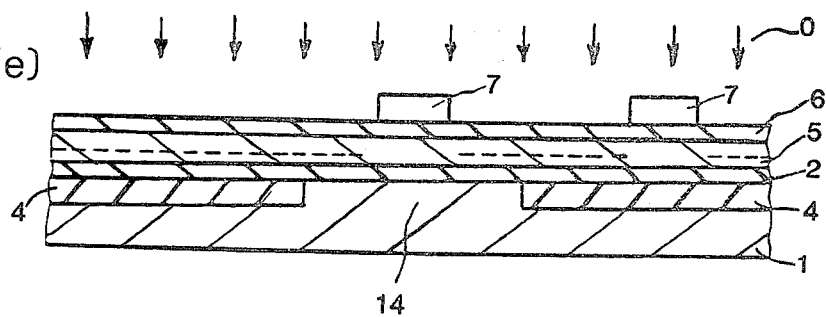

Then, as shown in FIG. 1(d), a single crystalline Si layer 5 of 3000 Å thickness is formed by epitaxial growth on the surface of the single crystalline $CeO_2$ layer 2.

As shown in FIG. 1(i e), the semiconductor layer 5 is covered with a single crystalline $CeO_2$ layer 6 of 1000Å thickness by the Verneuil method.

A photoresist mask 7 is selectively formed over region 14 where an active element is to be formed and over the semiconductor layer 5 where a connection region is to be formed, such as a gate of a MOS transistor or connection (not shown) between elements.

Oxygen is ion-implanted into the substrate under the conditions of 100 keV and $1 \times 10^{18}/cm^2$ dose using the photoresist mask 7 as a mask.

Oxygen ions are introduced into the semiconductor layer 5, but not into the semiconductor substrate 1 under the single crystalline $CeO_2$ layer 2.

Figure 1F:
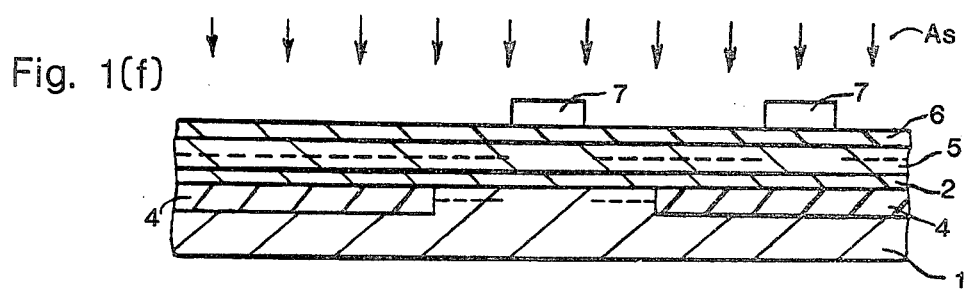

These oxygen ion implanted regions are transformed into $SiO_2$ layer 8 by a reaction of oxygen with the Si of the semiconductor layer 5 by the thermal process such as the temperature of about 900° to 1000° for about 30 minutes. As shown in FIG. 1(f), arsenic ions are ion-implanted into the substrate under the conditions of 700 keV and $1 \times 10^{15}/cm^2$ dose by using the photoresist layer 7 as a mask to form source and drain regions of the MOS transistor.

Figure 1G:
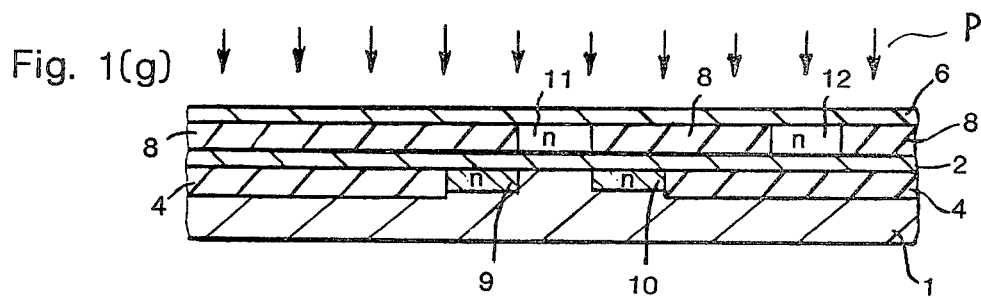

The implanted arsenic is introduced into semiconductor substrate 1 through the semiconductor layer 5. The arsenic ion implanted regions are transformed into a source and a drain region of the MOS transistor by a thermal process such as at the temperature of about 900° C. to 1000° C. for about 15 minutes. As shown in FIG. 1(g), the photoresist layer 7 is then removed, and phosphorus ions are ion-implanted into the semiconductor layer 11, 12 under the condition of 250 keV and $1 \times 10^{15}/cm^2$ dose. The gate region 11 of the MOS transistor and the connection region 12 have n-type impurity.

The prementioned thermal process is performed to activate the source and the drain regions.

As described, a single crystalline $CeO_2$ layer 2 is formed on the semiconductor substrate by using epitaxial growth. The multi-layer device having the single crystalline $CeO_2$ insulation layer and the single crystalline Si layer have semiconductor elements formed on the semiconductor layer having insulation layer regions by repeating the above-mentioned process.

Moreover, in this case a single crystalline $CeO_2$ insulation layer 6 is also formed on the epitaxial growth single crystalline silicon. The single crystalline $CeO_2$ insulation layer 6 can be used in the process where an epitaxial growth single crystalline silicon (not shown) is formed on layer 6. The $CeO_2$ layer 6 is eliminated if it is not necessary to have additional semiconductor layers in the device.

Another embodiment, shown in FIGS. 2(a)–2(d), will now be described.

When regions implanted with oxygen ions in the Si substrate are transformed into $SiO_2$ regions, the volume of the implanted regions increase during the subsequent thermal process, if the single insulation $CeO_2$ layer is thin. The surface of the Si substrate as a result can become uneven. Unevenness of the surface is unsuitable for the three-dimensional structure. This embodiment prevents this problem.

Figure 2A:
FIGS. 2(a) to 2(d) are sectional views illustrating another embodiment of the method according to the present invention in sequential steps.

As shown in FIG. 2(a), a part of Si substrate 201 in which the field insulation layer is to be formed is etched by using a photo etching process. The thickness of 1000Å~2000Å of the etched region is about a half thickness (500Å~1000Å) SiO$_2$ film formed by the following steps.

Figure 2B:

Next, as shown in FIG. 2(b), an insulation layer such as a single crystalline CeO$_2$ layer 202 of 300Å thickness is formed on a semiconductor substrate 201 by the Verneuil method using a high frequency plasma torch after oxygen gas at a pressure of about $10^{-6}$ torr is introduced into a vacuum of about $10^{-7}$ torr.

Figure 2C:
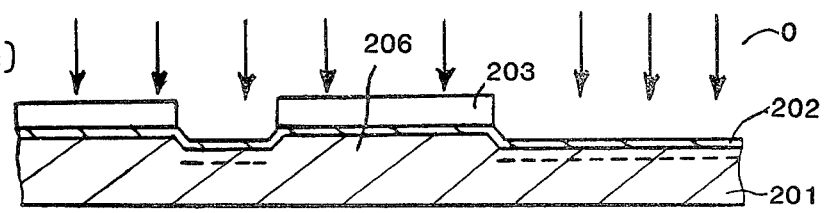

Then, as shown in FIG. 2(c), photoresist layer 203 is selectively formed over region 206 in which an active element will be formed, for example, an MOS transistor (not shown). Oxygen ions are introduced into the substrate 201 under the conditions of 80 keV and $1 \times 10^{10}/cm^2$ dose by using the photoresist layer 203 as a mask.

Figure 2D:
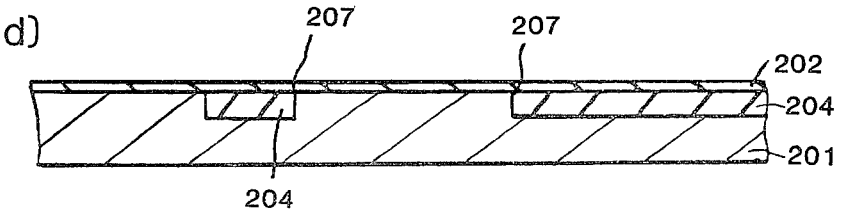

Then, as shown in FIG. 2(d), the oxygen ion implanted region is transformed into a SiO$_2$ insulation layer 204 by the reaction of oxygen with the silicon. The silicon substrate 201 becomes an even or flat structure because of the increase in volume of the transformed SiO$_2$ insulation layer 204. The crystalline structure of the single crystalline CeO$_2$ layer around the regions 207 of an active element 206 may be temporarily lost. But solid epitaxial growth of CeO$_2$ layer is caused from the neighboring parts of CeO$_2$ layer 202. Thus a complete single crystalline CeO$_2$ layer is formed on the silicon substrate 201.

Next, the third embodiment shown in FIGS. 3(a) to 3(g) will be explained. In the first and second embodiments, the single crystalline Si epitaxial growth layer is formed on the single crystalline Si substrate after all of it is covered by the single crystalline CeO$_2$ layer. In the embodiment of FIGS. 3(a) to 3(g), after the single crystalline CeO$_2$ layer is partly removed by the photoetching process a part of the exposed Si substrate is utilized as the connection between the Si epitaxial growth layer and the Si substrate.

This embodiment will now be described in more detail. FIGS. 3(a) to 3(g) are schematic sectional views for explaining this embodiment.

Figure 3A:
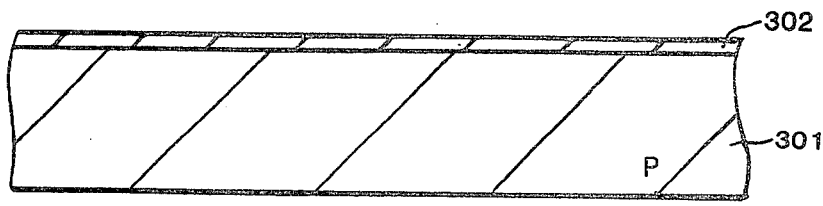

As shown in FIG. 3(a), a semiconductor substrate 301 as a starting substrate is set in a vacuum exhausted to $10^{-7}$ torr. Oxygen gas, at a pressure of about $10^{-6}$ torr, is introduced. Under this condition, the temperature of the semiconductor substrate 301 is kept at 500° C. and the high density electron flow of Ce metal vapor flow is then introduced. The single crystalline CeO$_2$ layer 302 is formed on the Si substrate 301 at the speed of about 50~500Å/min. The method of making this single crystalline CeO$_2$ layer 302 is the same as described above for the first two embodiments.

Figure 3B:
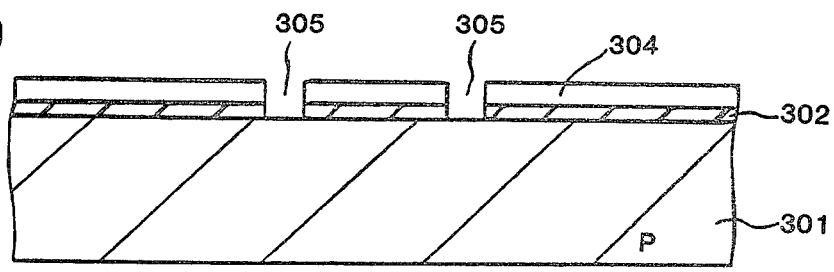

Next, as shown in FIG. 3(b), a photoresist layer 304 is selectively formed on regions of the CeO$_2$ layer 302 except over selected regions which are to connect to the Si substrate 301. A part of the CeO$_2$ layer 302 is removed at openings 305 by using the photoresist layer 304 as a mask.

Figure 3C:
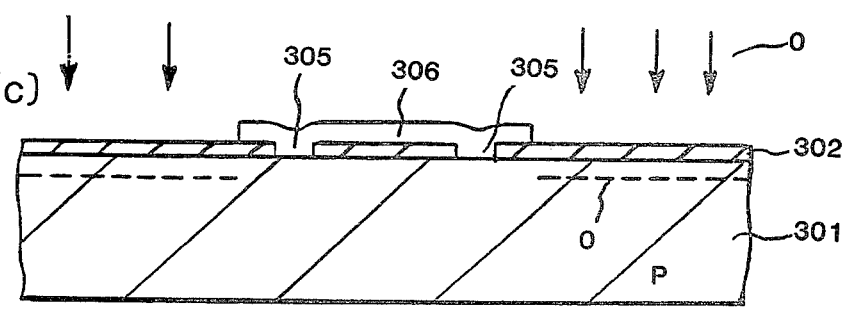

Next, as shown in FIG. 3(c), after removing the photoresist layer 304, a photoresist layer 306 is selectively formed on regions where an active element is to be formed and oxygen ions are implanted into the Si substrate 301 under the conditions of 100 keV and $1 \times 10^{18}/cm^2$ dose using the photoresist layer 306 as a mask.

Figure 3D:
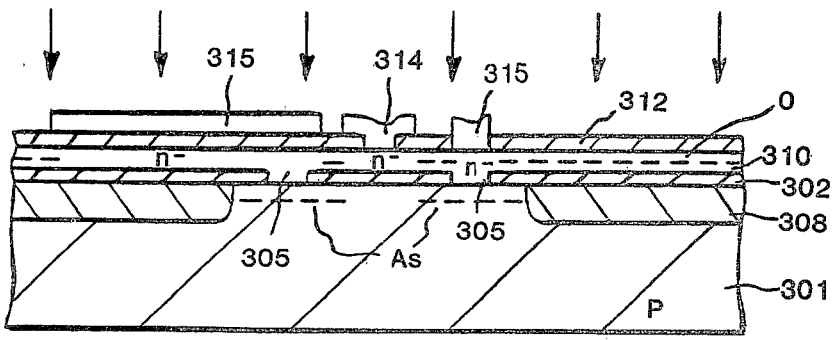

Then, as shown in FIG. 3(d), after removing the photoresist layer 306, the oxygen ion implanted regions are transformed into SiO$_2$ layer 308 by a reaction of oxygen with the Si of Si substrate 301 by the thermal process such as at the temperature of about 900° C. to 1000° C. for about 30 minutes. A single crystalline Si layer 310, doped by arsenic at a low density, is formed on the openings 305 of the Si substrate 301 and on the single crystalline CeO$_2$ layer 302 by using them as the seed for epitaxial growth. A single crystalline CeO$_2$ layer 312 is formed on the single crystalline Si layer 310 by the above mentioned method. Also, as in FIG. 3(b), selected regions connecting through single crystalline CeO$_2$ layer 312 are removed by the etching process (not shown). Moreover, after a SiO$_2$ layer 314 is selectively formed on the Si layer 310 photoresist 315 is selectively formed on CeO$_2$ layer 312 and Si layer 310 where the active element is to be formed. An oxygen ion is introduced into the Si layer 310 under the conditions of 100 keV and $1 \times 10^{18}/cm^2$ dose using the SiO$_2$ layer 314 and the photoresist 315 as a mask. Next, after removing the photoresist mask 315, arsenic ions are ion-implanted into the Si layer 301 under the conditions of 500~700 keV and $1 \times 10^{15}/cm^2$ dose using the SiO$_2$ layer 314 as a mask. The peak value of this ion-implantation is in the surface region of the Si substrate for forming the source and drain regions of the first MOS transistor.

Figure 3E:
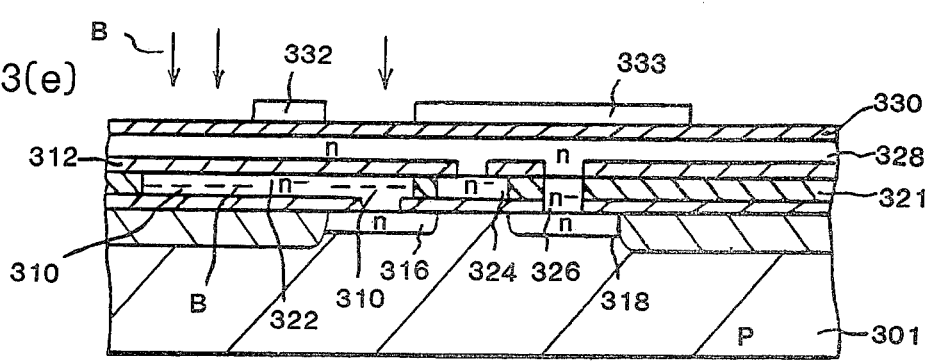

Next, as shown in FIG. 3(e), the arsenic ion implanted regions are transformed into the source 316 and drain 318 regions of the first MOS transistor through a thermal process. The regions not subjected to oxygen ion-implanting form the channel region 322 of the second MOS p-channel transistor, the gate region 324 of the first MOS n-channel transistor and the connection region 326 SiO$_2$ insulation layer 321 is then formed by a thermal process. Next, after removing the SiO$_2$ layer 314, a 3000Å thickness single crystalline Si layer 328, including a phosphorous ion, is formed on the CeO$_2$ layer 312 with openings oer the regions 324, 326 of the Si layer. Next, using the above mentioned method, a single crystalline CeO$_2$ layer 330 of thickness 1000Å is formed on the single crystalline Si layer 328. After a SiO$_2$ layer 332 and a photoresist pattern 333 are selectively formed on this CeO$_2$ layer 330, boron ions are ion-implanted into the single crystalline Si layer 310 under the conditions of 160 keV and $1 \times 10^{15 \sim 16}/cm^2$ dose using the SiO$_2$ layer 332 and the photoresist pattern 333 as a mask.

Next, as shown in FIG. 3(f), after removing the photoresist layer 333, a photoresist layer 334 is formed on the CeO$_2$ layer 330. Oxygen ions are implanted into the single crystalline Si layer 328 under the conditions of 100 keV and $1 \times 10^{18}/cm^2$ dose using the SiO$_2$ layer 332 and the photoresist layer 334 as a mask. The regions, ion-implanted with boron in the step of FIG. 3(e), are changed to the source and drain regions 336, 338 of the second MOS p-channel transistor after the thermal process. The resistance of the gate region 324 of the first MOS transistor and of the connection region 326 is decreased by auto-doping of the phosphrous from the single crystalline Si layer 328 by the thermal process such as at the temperature of about 1000° C. for about 30 minutes.

Next, as shown in FIG. 3(g), after removing the SiO$_2$ layer 332 and the photoresist layer 334, the oxygen ion implanted region in FIG. 3(f) is converted into SiO$_2$ layer 340 by reacting with the Si through the thermal process. The gate region of the second MOS p-channel transistor 342, the connection region 344 of the first MOS transistor gate and the connection region 346 are formed. Next, the gate region of the first MOS transistor and the gate region of the second MOS transistor are connected (not shown). The CMOS inverter is completed by connecting the source and drain regions of the first and second transistors (not shown).

The first MOS transistor and the second MOS transistor are formed in the multi-layer structure as above mentioned. Furthermore, the packing density is increased, for the source region 316 of the first MOS n-channel transistor and the drain region 338 of the 2nd MOS p-channel transistor are formed in the double layer structure.

Next, as shown in FIG. 4, it is possible to form a bipolar transistor and a MOS transistor in the multi-layer structure. FIG. 4 shows that the bipolar transistor is formed in the Si epitaxial growth layer on the single crystalline $CeO_2$ layer. Since the $CeO_2$ layers 402, 404, the Si epitaxial layer 409, the field regions 401 of the MOS transistor 416 and the $SiO_2$ layer 406 are formed on the Si substrate 408 in the same manner as in the first three embodiments, the explanation will be omitted. The Si epitaxial layer 409, which is boron doped, is formed on the $CeO_2$ layer 402. A collector region 410 is formed by ion-implanting phosphorus under the conditions of 100 keV and $3 \times 10^{16}/cm^2$ dose. A base region 412 is formed by boron ion implanting under the conditions of 100 keV and $5 \times 10^{15 \sim 16}/cm^2$ dose. The emitter region 414 is formed by an arsenic ion implantation under the conditions of 300 keV and $1 \times 10^{16}/cm^2$ dose. These regions are activated after the thermal process. This thermal process may be done by conventional techniques such as at the temperature of about 400° C. to 1000° C. for about 15 minutes.

As mentioned above, in the method for making the three-dimensional structure, the single crystalline Si epitaxial growth layer may be formed on the single crystalline $CeO_2$ layer which is formed on the Si substrate and the thick field region may be formed in the Si substrate or the Si layer. Therefore the breakdown voltage of the field region is high.

Moreover, the various active and passive elements, for example, the MOS transistor, the bipolar transistor, the resistor, and so on may be formed in the single crystalline Si epitaxial growth layer. Also, the connection of the Si substrate and the Si epitaxial growth layer may be formed. Therefore the packing density is increased.

It should be understood that this semiconductor device may be modified or changed within the scope of the present invention.

What is claimed is:

1. A method of fabricating a semiconductor device having a first semiconductor layer which comprises the steps of:
    (a) forming a single crystalline oxide insulation layer which is selected from the group consisting of Ce and other rare earth elements where said layer belongs to a system which is selected from the group consisting of a tesseral system, a tetragonal system and an orthorhombic system on at least part of the first semiconductor layer;
    (b) selectively introducing ions, which convert semiconductor material into an insulation material by reacting with said first semiconductor layer, through said single crystalline oxide insulation layer into at least part of said first semiconductor layer;
    (c) converting said ion introduced region into an insulation layer, which is formed beneath said single crystalline oxide insulation layer; and
    (d) forming a second semiconductor layer on said single crystalline oxide insulation layer and said first semiconductor layer.

2. The method according to claim 1, wherein said first semiconductor layer, where said ions are to be introduced, is etched before step (a) to form recessed regions thereon.

3. The method according to claims 1 or 2, wherein the first semiconductor layer employed in step (a) is provided on an insulation substrate.

4. The method according to claim 3, wherein said insulation substrate is selected from the group consisting of a sapphire substrate and a spinel substrate.

5. The method according to claims 1 and 2, wherein said ions are selected from the group consisting of oxygen, nitrogen and carbon.

6. The method according to claims 1 or 2, wherein the lattice constant of said single crystalline oxide insulation layer is restricted to a range from 99% to 101% of that of said first semiconductor layer.

7. The method according to claims 1 or 2, wherein said single crystalline oxide insulation layer is formed by a Verneuil method.

8. The method according to claims 1 or 2, wherein a first conductive type channel insulated gate transistor is formed in said first semiconductor layer and a second conductive type channel insulated gate transistor is formed in said second semiconductor layer.

9. The method according to claims 1 or 2, wherein a bipolar transistor is formed in said first semiconductor layer.

* * * * *